(12) United States Patent
Yamashita

(10) Patent No.: US 9,606,162 B2
(45) Date of Patent: Mar. 28, 2017

(54) INSULATION INSPECTION METHOD AND INSULATION INSPECTION APPARATUS

(71) Applicant: Munehiro Yamashita, Kyoto (JP)

(72) Inventor: Munehiro Yamashita, Kyoto (JP)

(73) Assignee: Nidec-Read Corporation, Kyoto (JP)

( * ) Notice: Subject to any disclaimer, the term of this patent is extended or adjusted under 35 U.S.C. 154(b) by 155 days.

(21) Appl. No.: 14/399,910

(22) PCT Filed: May 8, 2013

(86) PCT No.: PCT/JP2013/062900
§ 371 (c)(1),
(2) Date: Nov. 7, 2014

(87) PCT Pub. No.: WO2013/168729
PCT Pub. Date: Nov. 14, 2013

(65) Prior Publication Data
US 2015/0084643 A1    Mar. 26, 2015

(30) Foreign Application Priority Data

May 8, 2012    (JP) .................................. 2012-106843

(51) Int. Cl.
*G01R 31/02* (2006.01)
*G01R 31/28* (2006.01)

(52) U.S. Cl.
CPC ....... *G01R 31/024* (2013.01); *G01R 31/2812* (2013.01); *G01R 31/2805* (2013.01)

(58) Field of Classification Search
CPC .... G01R 31/00; G01R 31/005; G01R 31/006; G01R 31/02; G01R 31/021; G01R 31/022; G01R 31/024; G01R 31/025; G01R 31/026; G01R 31/083; G01R 31/12; G01R 31/1272; G01R 31/14; G01R 31/2805; G01R 31/2812; G01R 27/02; G01R 27/2605; G01R 1/07328; G01N 27/82; G01N 27/90; G01N 27/9046; B60L 3/0069; B60L 3/04;
(Continued)

(56) References Cited

U.S. PATENT DOCUMENTS

2016/0054373 A1* 2/2016 Kasai .................. G01R 31/14
324/551

FOREIGN PATENT DOCUMENTS

JP    62-282277 A    12/1987
JP    06-148253 A    5/1994
(Continued)

OTHER PUBLICATIONS

Jan. 26, 2016 office action of JP2012-106843.

*Primary Examiner* — Hoai-An D Nguyen
(74) *Attorney, Agent, or Firm* — Wiggin and Dana LLP; Abraham Kasdan; Jonathan D. Hall

(57) ABSTRACT

An insulation test apparatus and method for a circuit board having a plurality of wiring patterns formed thereon includes: selection means for selecting wiring patterns to be tested, power supply means for sending a predetermined electrical output between a first object to be measured and a target object to be measured; measurement means for measuring an electrical signal between the first object to be measured and the target object to be measured; and calculation means for calculating the resistance of an insulation failure portion between the first object to be measured and the target object to be measured.

16 Claims, 6 Drawing Sheets

(58) Field of Classification Search
CPC ......... B60L 2240/547; B60L 2270/147; H01B 7/328; H04B 3/46
USPC ....... 324/500, 509, 537, 539, 541, 543, 544, 324/551, 763.01
See application file for complete search history.

(56) References Cited

FOREIGN PATENT DOCUMENTS

| | | | |
|---|---|---|---|
| JP | 06-230058 A | | 8/1994 |
| JP | 2002-26100 A | | 1/2002 |
| JP | 2005-55369 A | | 3/2005 |
| JP | 2005-069864 A | | 3/2005 |
| JP | 2007139797 A | * | 6/2007 |
| JP | 2008089485 A | * | 4/2008 |
| JP | 2008-139036 A | | 6/2008 |
| JP | 2009109379 A | * | 5/2009 |
| JP | 2009-186198 A | | 8/2009 |
| JP | 2010210510 A | * | 9/2010 |

* cited by examiner

INSULATION INSPECTION METHOD AND INSULATION INSPECTION APPARATUS

TECHNICAL FIELD

The invention relates to an insulation test method and an insulation test apparatus. More specifically, the invention relates to an insulation test method and an insulation test apparatus each capable of calculating an accurate resistance value of a portion where a short-circuit failure occurs, upon finding such short-circuit failure between wiring patterns on a circuit board.

The invention is applicable to a test for electrical wiring in various circuit boards including not only printed circuit boards, but also, for example, flexible printed circuit boards, multilayer circuit boards, electrode plates for liquid crystal displays and plasma displays, and package boards and film carriers for semiconductor packages. In this description, these wiring boards are collectively referred to as a "circuit board".

BACKGROUND

Wiring patterns on a circuit board are formed to have various sizes and shapes. In order to test whether each of the wiring patterns is formed to have a desired shape and the like, a test is conducted as to whether the wiring pattern is formed in a favorable state by calculating a resistance value between predetermined two points (a continuity test) or calculating an insulation property between predetermined two points (an insulation test).

A conventional approach for testing a plurality of wiring patterns to be tested is a continuity test that involves defining desired sites, which are electrically connected to wiring patterns, on a surface of a circuit board as test points, and sending an electric signal between the desired test points, thereby testing for electrical continuity between the test points on the wiring pattern.

Moreover, a conventional typical approach for testing an insulation state between a first wiring pattern and a second wiring pattern is an insulation test that involves sending an electric signal to a test point on a first wiring pattern, and measuring an electric signal detected from a test point on a second wiring pattern, thereby testing insulation state between the wiring patterns.

In particular, wiring patterns on a circuit board are formed more finely and have become more complicated with recent miniaturization of such circuit boards. Moreover, the wiring patterns are formed with narrower pitches. As a result, the manufacturing process tends to become more complicated. Therefore, an insulation failure which cannot be found by a conventional insulation test is a problem. In order to solve the problem in the prior art, a test is conducted by changing a value of voltage applied to or current fed to a wiring pattern in a stepwise manner so as to prevent an insulation failure portion and the like of the wiring pattern from being burned down by overcurrent (see, JP 6-230058A).

The applicant has proposed a circuit board testing method capable of finding the existence of an insulation failure including a pseudo short-circuit portion where adjacent wiring patterns are short-circuited in a pseudo manner (see, JP 2008-139036A).

However, while the insulation test methods disclosed in Patent Literature 1 or 2 are capable of finding an insulation failure or a pseudo insulation failure between wiring patterns, they are incapable of calculating an accurate resistance value for the failure.

Heretofore, circuit boards with a short-circuit failure have been usually discarded. However, the probability that such a failure occurs has increased because the wiring patterns are formed to have narrower line widths and pitch widths as described above. As a result, the higher defective rate adversely affects circuit board manufacturing costs. Circuit board manufacturers have a significant challenge to reduce the defect rate caused by such failure and analyzing the failure is an important factor.

SUMMARY OF THE INVENTION

A first aspect of the invention is directed to an insulation test apparatus for conducting an insulation test on a plurality of wiring patterns on a circuit board. The insulation test apparatus includes: selection means for selecting a wiring pattern to be tested, as a first object to be measured and selecting a wiring pattern where an insulation failure occurs in conjunction with the first object to be measured, as a target object to be measured, from among the plurality of wiring patterns; power supply means for sending a predetermined electric signal between the first object to be measured and the target object to be measured; measurement means for measuring an electrical signal at the time when the power supply means sends its electrical output between the first object to be measured and the target object to be measured; and calculation means for calculating an electrical characteristic of an insulation failure portion between the first object to be measured and the target object to be measured, on the basis of the electric signal sent by the power supply means and the measured value measured by the measurement means, wherein the selection means establishes an electrical connection between a first end of the first object to be measured and a first end of the power supply means, the selection means establishes an electrical connection between a second end of the first object to be measured and a first end of the measurement means, the selection means establishes an electrical connection between a first end of the target object to be measured and a second end of the power supply means, and the selection means establishes an electrical connection between a second end of the target object to be measured and the second end of the measurement means.

A second aspect of the invention is directed to the insulation test apparatus of the first aspect, further including: control means for prompting the selection means, the measurement means, and the calculation means to perform predetermined operations, wherein the control means prompts the selection means to connect the wiring patterns other than the wiring pattern selected as the first object to be measured, in parallel with one another, and to select each of the wiring patterns as a second object to be measured, the control means prompts the power supply means to send a predetermined electric signal between the first object to be measured and the second object to be measured, the control means prompts the measurement means connected to the first object to be measured or the second object to be measured in series to measure an electrical signal between the first object to be measured and the second object to be measured, the control means prompts the calculation means to calculate an insulation state between the first object to be measured and the second object to be measured, on the basis of the electric signal and the measured value, and the control means prompts the selection means to select the wiring pattern where an insulation failure occurs in conjunction with the first object to be measured, as the target object to be measured, when the insulation state calculated by the calculation means is not favorable.

A third aspect of the invention is directed to the insulation test apparatus of the second aspect, wherein in order to identify the wiring pattern where the insulation failure portion arises in conjunction with the first object to be measured, in the case where the insulation state calculated by the calculation means is not favorable, the control means prompts the selection means to select one of the wiring patterns each selected as the second object to be measured, the control means prompts the power supply means to send a predetermined electric signal between the first object to be measured and the selected wiring pattern, the control means prompts the measurement means to measure an electrical signal between the first object to be measured and the selected wiring pattern, the control means prompts the calculation means to calculate an insulation state between the first object to be measured and the selected wiring pattern, on the basis of the electric signal and the measured value, and the control means identifies the wiring pattern where the insulation failure portion arises in conjunction with the first object to be measured, on the basis of the calculated insulation state result.

A fourth aspect of the invention is directed to an insulation test method for conducting an insulation test on a plurality of wiring patterns on a circuit board, the insulation test method including: selecting a wiring pattern to be tested, as a first object to be measured and selecting wiring patterns other than the first object to be measured, as a second object to be measured from among the plurality of wiring patterns; calculating an insulation state between the first object to be measured and the second object to be measured; calculating an insulation failure between the first object to be measured and the second object to be measured; detecting a wiring pattern where an insulation failure portion arises in conjunction with the first object to be measured, from the second objects to be measured; sending a predetermined electric signal between the wiring pattern, where the insulation failure occurs in conjunction with the first object to be measured, and the first object to be measured, and measuring an electrical signal between the wiring pattern, where the insulation failure occurs in conjunction with the first object to be measured, and the first object to be measured; and calculating an electrical characteristic of the insulation failure portion between the first object to be measured and the target object to be measured, on the basis of the electric signal sent by the power supply means and the measured value measured by the measurement means.

Advantageous Effects of the Invention

According to the first aspect, the insulation test apparatus can calculate an accurate resistance value of an insulation failure.

According to the second aspect, the insulation test apparatus can conduct an insulation test on wiring patterns on a circuit board, and calculate an accurate resistance value of an insulation failure occurring at a wiring pattern on the circuit board in the insulation test.

According to the third aspect, the insulation test apparatus can identify a wiring pattern where an insulation failure portion arises in conjunction with a wiring pattern to be tested, upon detection of the insulation failure in the insulation test. Therefore, the insulation test apparatus can calculate a resistance value of the insulation failure portion in a series of processes of the insulation test.

According to the fourth aspect, the insulation test method can calculate a resistance value of an insulation failure portion, upon detection of the insulation failure in the insulation test. Therefore, the insulation test method can calculate the resistance value of the insulation failure portion in the series of processes of the insulation test.

DETAILED DESCRIPTION

A description will be given of the best mode for embodying the invention.

Figure 1:
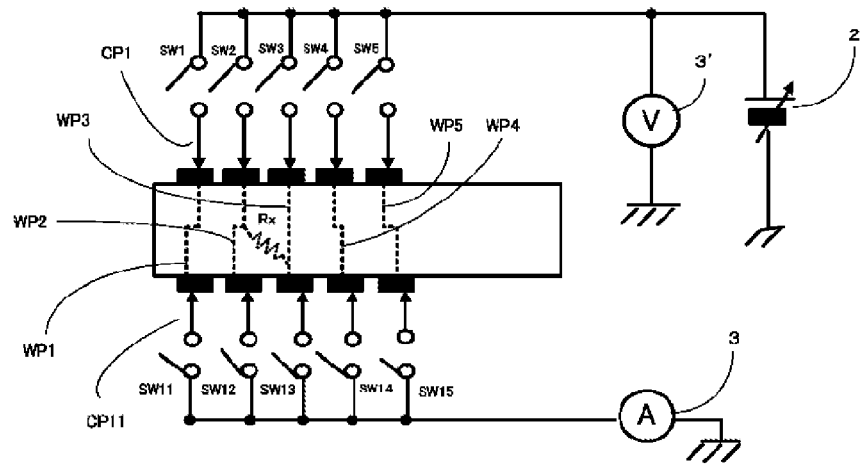
FIG. 1 is a schematic configuration diagram illustrating an insulation test method according to the invention.

First, a description will be given of an insulation test method according to the invention. FIG. 1 illustrates an insulation test to be conducted on a circuit board CB. The circuit board CB illustrated in FIG. 1 has five wiring patterns WP (wiring patterns WP1 to WP5) formed thereon. In the circuit board CB, an insulation failure portion Rx arises between the wiring pattern WP2 and the wiring pattern WP3. For example, the wiring pattern WP2 and the wiring pattern WP3 may be short-circuited.

As illustrated in FIG. 1, contact probes CP (e.g., probe CP1 and CP11) are brought into electrical contact with respective test points (test points S1 to S5, S11 to S15) defined on the respective wiring patterns WP1-WP5, in order to conduct the insulation test on the circuit board CB. The probes CP are connected to switches SW (SW1 to SW5, SW11 to 15). Moreover, power supply means 2 and measurement means 3 are disposed for conducting the insulation test. An insulation state is calculated on the basis of a value of the electrical output supplied from the power supply means 2 and a value of the electric signal measured by the measurement means 3.

The power supply means 2 illustrated in FIG. 1 is a variable voltage source, but not particularly limited thereto so long as one is able to appropriately adjust and apply voltage giving a predetermined potential for conducting the insulation test. The measurement means 3 illustrated in FIG. 1 may be an ammeter, but is not particularly limited thereto so long as it is able to detect a characteristic electrical signal between target objects. A voltmeter 3' may be disposed to confirm that a predetermined potential difference for conducting the insulation test exists between target objects.

Figure 2:
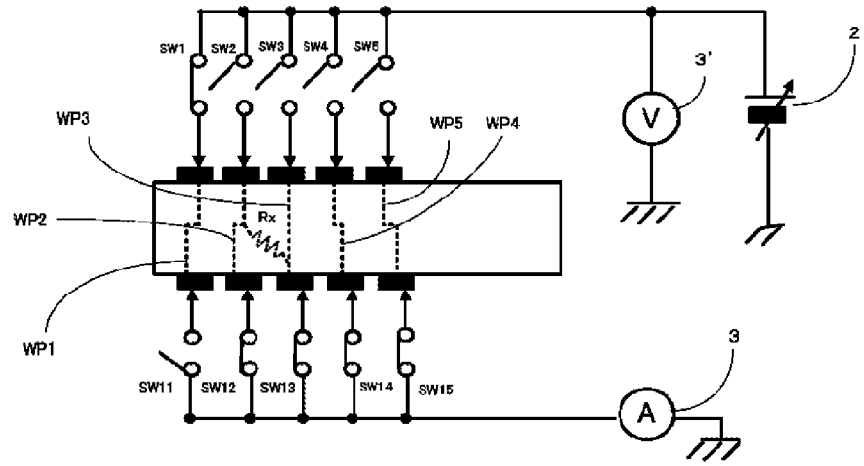
FIG. 2 is a schematic diagram illustrating the insulation test method according to the invention, conducted with a wiring pattern WP1 selected as a target object.

The insulation test is conducted on each of the five wiring patterns WP on the circuit board CB as follows. As illustrated in FIG. 2, for example, when the wiring pattern WP1 is set as a wiring pattern to be tested, the switch SW1 is closed to connect the wiring pattern WP1 to the power supply means 2. Moreover, the switches SW12 to SW15 are closed to connect the wiring patterns WP2 to WP5 to the measurement means 3 in series. In this case, an insulation state is determined on the basis of a value of the electrical output (e.g. voltage) supplied from the power supply means 2 and an electric signal (e.g. current) measured by the measurement means 3. The wiring pattern WP1 is set as a target object as described above, and the insulation test is conducted on the circuit board CB in such a manner that all the wiring patterns WP are selected as a target object.

Figure 3A:
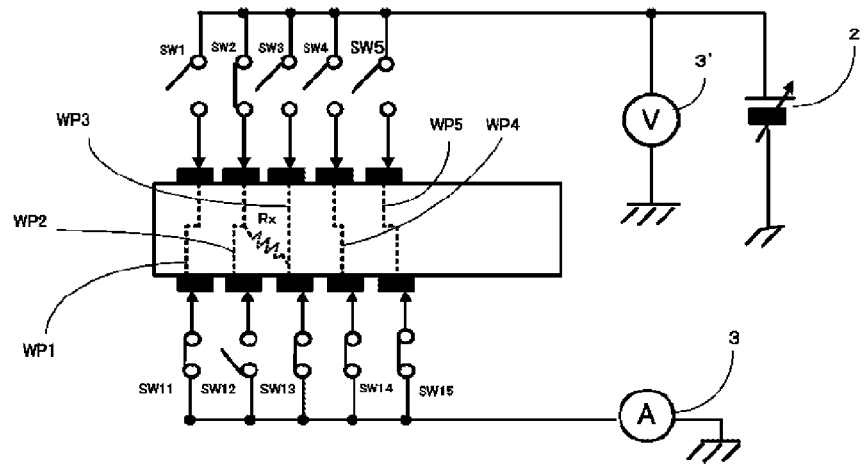
FIG. 3A illustrates the insulation test conducted with a wiring pattern WP2 selected as a target object.

Since an insulation failure portion Rx arises in the circuit board CB, the insulation failure is detected when the wiring pattern WP2 is selected as a target object (see FIG. 3A). At this time, the wiring pattern WP2 is connected to the power supply means 2, and each of the wiring patterns WP1 and WP3 to WP5 is connected to the measurement means 3. In this case, the measurement means 3 measures an electric signal value exceeding a predetermined reference value because of the insulation failure portion Rx.

Figure 3B:
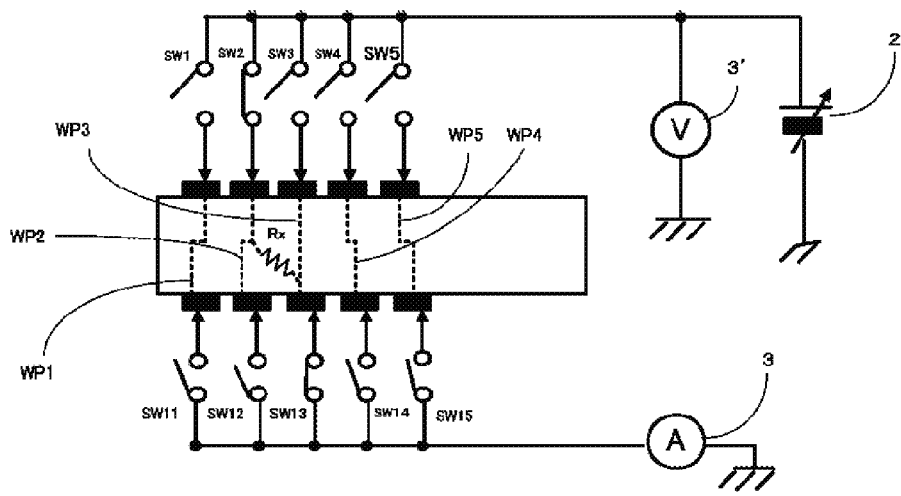
FIG. 3B illustrates a state that an insulation failure portion is detected at the wiring pattern WP2.

When it is determined that the wiring pattern WP2 exhibits an insulation failure, the remaining wiring patterns WP are subjected to measurement to determine which wiring pattern causes the insulation failure in conjunction with the wiring pattern WP2. In this case, the measurement means 3 measures electric signals sent to all the remaining wiring patterns WP one by one with the wiring pattern WP2 connected to the power supply means 2, thereby finding the insulation failure portion Rx. In the case of the circuit board CB, as illustrated in FIG. 3B, when the switch SW13 is closed, a continuity state is established between the wiring pattern WP2 and the wiring pattern WP3 because of the insulation failure portion Rx. As a result, the measurement means 3 measures the electric signal due to the influence of the insulation failure portion Rx. Thus, the insulation failure portion Rx is found between the wiring pattern WP2 and the wiring pattern WP3.

Figure 4:
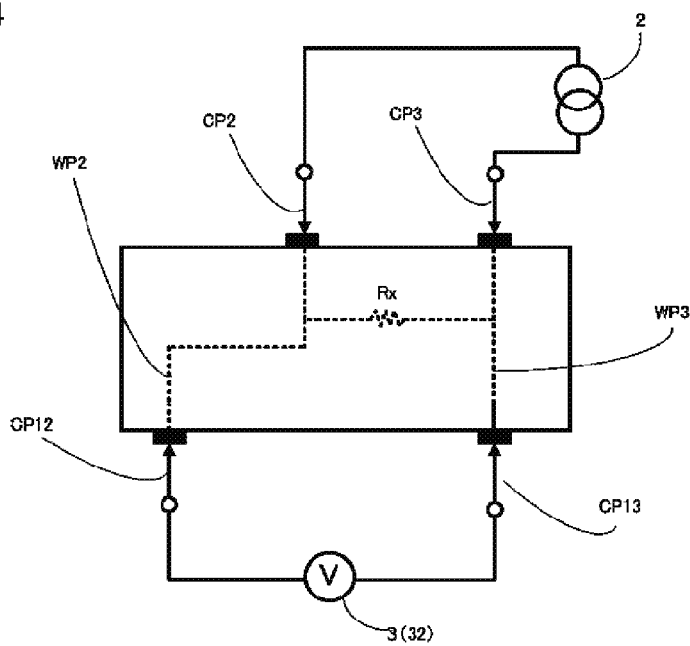
FIG. 4 is a schematic circuit diagram for calculating the insulation failure portion Rx at the wiring pattern WP2.

When the insulation failure portion Rx is found between the wiring pattern WP2 and the wiring pattern WP3, a resistance value of the insulation failure portion Rx is calculated. FIG. 4 is a schematic circuit diagram for calculating the resistance value of the insulation failure portion Rx. In the circuit diagram of FIG. 4, a first end of the power supply means 2 is connected to the wiring pattern WP2, and a second end of the power supply means 2 is connected to the wiring pattern WP3. The power supply means 2 to be used herein is preferably a constant current source, and the measurement means 3 to be used herein is preferably a voltmeter 32, for the purpose of calculating the resistance value of the insulation failure portion Rx.

In FIG. 4, current flows through a closed circuit formed of a part of the wiring pattern WP2, the insulation failure portion Rx, and a part of the wiring pattern WP3 by way of the probes CP2 and CP3, on the basis of power supplied from the power supply means 2. The measurement means 3 can measure a potential difference between both ends of the insulation failure portion Rx by way of the wiring patterns WP2 and WP3.

Therefore, the resistance value of the insulation failure portion Rx can be calculated on the basis of the current value output from the power supply means 2 and the voltage value measured by the measurement means 3.

Connecting the power supply means 2 and the measurement means 3 as illustrated in FIG. 4 allows calculation of the resistance value of only the insulation failure portion Rx by removal of contact resistance values of the respective probes CP and resistance values of the wiring patterns WP2 and WP3.

Therefore, the resistance value of the insulation failure portion Rx can be accurately and stably calculated without using a four-terminal measurement method.

Next, a description will be given of an insulation test apparatus according to the invention.

Figure 5:
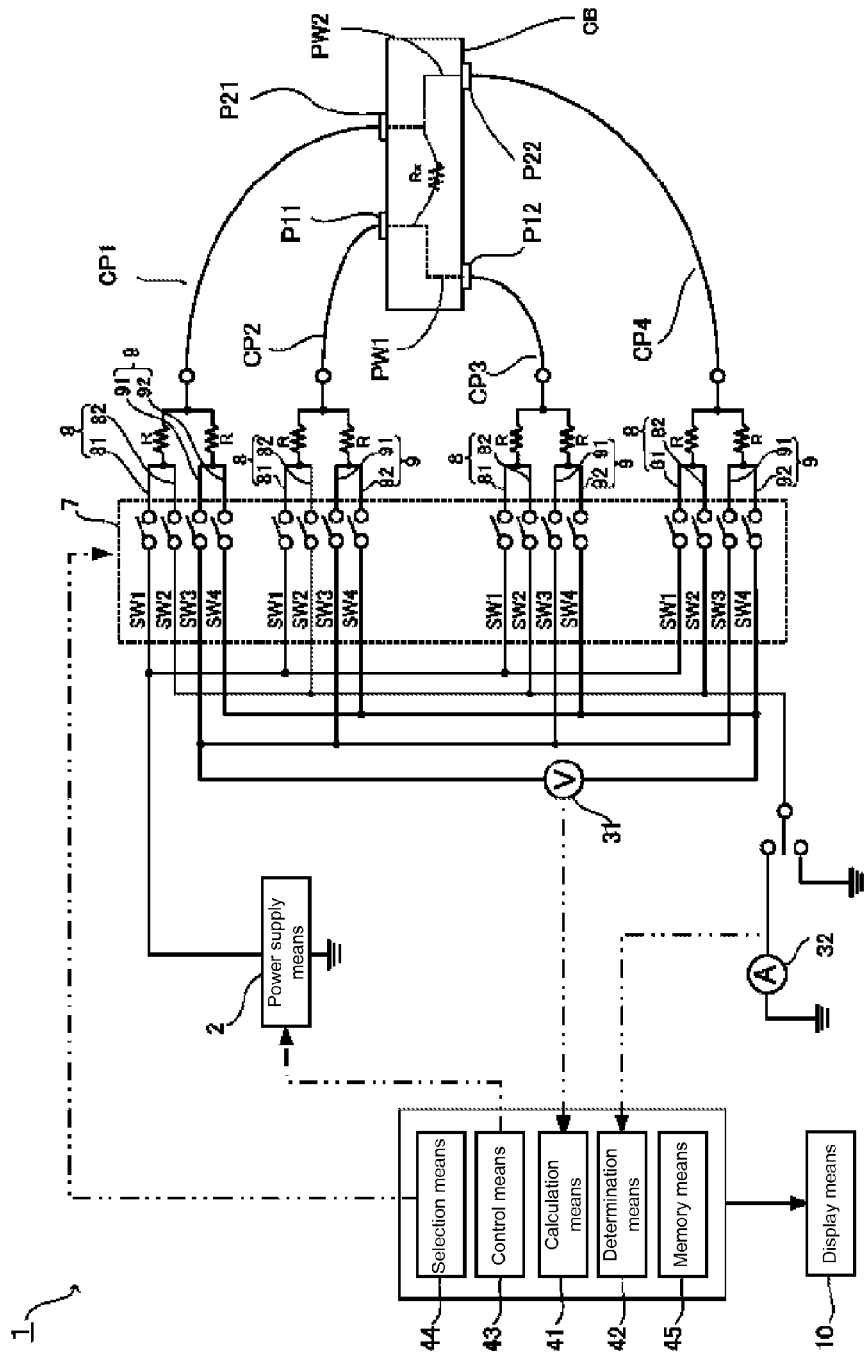
FIG. 5 is a schematic configuration diagram illustrating an insulation test apparatus for realizing the insulation test method.

FIG. 5 is a schematic configuration diagram illustrating the insulation test apparatus 1 for realizing the insulation test method. The insulation test apparatus 1 includes power supply means 2, measurement means 3, calculation means 41, determination means 42, control means 43, selection means 44, memory means 45, switch means 7, a first terminal 8, a second terminal 9, and display means 10.

The insulation test apparatus 1 employs contact probes (probes CP) electrically connected to test points P defined on wiring patterns WP on a circuit board CB. The insulation test apparatus 1 can transmit and receive a predetermined electric signal to and from a predetermined test point via the probe CP. The schematic configuration diagram of FIG. 5 illustrates an insulation test apparatus 1 that conducts an insulation test on the wiring patterns WP (WP1, WP2) on the circuit board CB.

The insulation test is usually conducted on all the wiring patterns. It is assumed in FIG. 5 that the circuit board CB has two wiring patterns PW1 and PW2 formed thereon and an insulation failure portion Rx arises between those wiring patterns.

The power supply means 2 sends a predetermined electric signal between target objects to be tested. The power supply means 2 sends the predetermined electric signal in the case of generating a predetermined potential difference upon conduct of the insulation test between the target objects to be tested and in the case of calculating a resistance value of the insulation failure portion Rx. The power supply means 2 may be a variable voltage source in the case of conducting the insulation test between the target objects to be tested. On the other hand, the power supply means 2 may be a constant current source in the case of calculating the insulation failure portion Rx.

The power supply means 2 appropriately changes voltage to be applied, in accordance with the case of conducting the insulation test and the case of calculating the resistance value of the insulation failure portion. In particular, when the insulation test is conducted with a large voltage value, the insulation failure portion Rx may be burned down. Consequently, the insulation test is conducted with a voltage value of 1 v or less so as to prevent the insulation failure portion Rx from being burned down. A high-voltage insulation test may be conducted after conduct of the low-voltage insulation test.

The measurement means 3 is capable of measuring an electric signal at a site connected thereto, and includes first measurement means 31 and second measurement means 32.

The first measurement means 31 is capable of measuring a potential difference between both terminals thereof. The first measurement means 31 to be used herein may be, for example, a voltmeter.

The second measurement means 32 is capable of measuring the magnitude of an electric signal passing therethrough. The second measurement means 32 to be used herein may be, for example, an ammeter.

The first measurement means 31 and the second measurement means 32 are connected to a predetermined wiring pattern WP via the switch means 7 which will be described later. The first measurement means 31 and the second measurement means 32 transmit the measured values to the memory means 45 which will be described later.

The calculation means 41 is capable of calculating an electrical characteristic on the basis of the measured electrical signal value from the measurement means 3 and the electrical output value from the power supply means 2. More specifically, the calculation means 41 is set to calculate a resistance value upon reception of the measured value and the electric signal value. The calculation means 41 transmits the calculated resistance value to the memory means 45.

The calculation means 41 calculates an insulation state between a first object to be measured and a second object to be measured in an insulation test. When an insulation failure portion Rx is identified, the calculation means 41 calculates a resistance value of the insulation failure portion Rx.

Upon conduct of the insulation test between the target objects, the determination means 42 determines an insulation state between the target objects, on the basis of the resistance value calculated by the calculation means 41. The determination means 54 may determine whether or not the target object is not defective by comparing the calculation result with a preset reference value that corresponds to a resistance value for a non-defective target object.

It is important for the insulation test to determine whether an insulation property between target objects is maintained with reliability. The determination means 42 determines that the insulation state is favorable when the calculation result is larger than the reference value. On the other hand, the determination means 42 determines that the insulation state is not favorable when the calculation result is smaller than the reference value. The reference value may be set for each target object or for each predetermined group. When the determination means 42 determines whether a circuit board CB is a non-defective or a defective, the display means 10 displays thereon the determination result, as will be described later.

The control means 43 transmits electric signals for prompting the power supply means 2, the measurement means 3, the calculation means 41, the determination means 42, the selection means 44, the memory means 45, and the switch means 7 to perform predetermined operations, respectively. The memory means 45 may store therein the operation of the control means 43, and the respective means are controlled to operate in accordance with the stored control procedure. The control means 43 prepares a control signal so as to conduct the insulation test described above.

In the insulation test, the selection means 44 selects one wiring pattern WP to be tested, from among the plurality of test points on the circuit board CB, sets the selected wiring pattern WP as a first object to be measured, and sets each of the remaining wiring patterns WP as a second object to be measured. In order to identify the insulation failure portion Rx, moreover, the selection means 44 selects the wiring patterns other than the wiring pattern WP set as the first object to be measured, one by one as a target object to be tested as to an insulation failure. When the insulation failure portion is identified, the selection means 44 selects, as a target object to be measured, the wiring pattern WP where the insulation failure occurs in conjunction with the first object to be measured.

The selection means 44 selects target objects to be subjected to the insulation test or target objects to be measured as to whether an insulation failure portion arises.

The selection by the selection means 44 is specifically implemented by closing and opening switching elements SW of the switch means 7.

The memory means 45 stores therein the electric signal value from the power supply means 2, the electric signal value from the measurement means 3, the resistance value calculated by the calculation means 41, the determination result by the determination means 42, and the control procedure of the control means 43. The memory means 45 also stores therein, for example, information on the circuit board CB, information on the wiring patterns WP, and information on the test procedure. The information is appropriately utilized as necessary.

The switch means 7 includes the plurality of switching elements SW electrically connected to the corresponding probes CP. The switch means 7 closes and opens each switching element SW on the basis of an operation signal from the selection means 44. That is, the switching operation of the switch means 7 allows selection of a test point to be tested.

The first terminal 8 is connected to the wiring pattern WP via the probe CP such that the power supply means 2 sends an electric signal to the wiring pattern WP. The first terminal 8 includes an upstream first terminal 81 and a downstream first terminal 82. The upstream first terminal 81 connects an upstream side (positive electrode side) of the power supply means 2 to the wiring pattern WP. The downstream first terminal 82 connects a downstream side (negative electrode side) of the power supply means 2 or the second measurement means 32 to the wiring pattern WP.

The upstream first terminal 81 and the downstream first terminal 82 are connected to the switching elements SW of the switch means 7, respectively. The upstream first terminal 81 and the downstream first terminal 82 are connected to and disconnected from the switching elements SW of the switch means 7 in such a manner that the switch means 7 closes and opens the respective switching elements SW.

As illustrated in FIG. 5, each of the upstream first terminal 81 and the downstream first terminal 82 in the first terminal 8 is connected to the wiring pattern WP via a protective resistor R. The protective resistor R is disposed for protection from electrostatic discharge.

The second terminal 9 is connected to the wiring pattern WP via the probe CP such that the measurement means 3 measures an electric signal sent to the wiring pattern WP. In the embodiment illustrated in FIG. 5, the second terminal 9 is connected to the predetermined wiring pattern WP such that the first measurement means 31 can measure the electric signal.

The second terminal 9 includes an upstream second terminal 91 and a downstream second terminal 92. The upstream second terminal 91 connects an upstream side (positive electrode side) of the first measurement means 31 to the wiring pattern WP. The downstream second terminal 92 connects a downstream side (negative electrode side) of the first measurement means 31 to the wiring pattern WP.

As in the case of the first terminal 8, the upstream second terminal 91 and the downstream second terminal 92 are connected to the switching elements SW of the switch means 7, respectively. The upstream second terminal 91 and the downstream second terminal 92 are connected to and disconnected from the switching elements SW of the switch means 7 in such a manner that the switch means 7 closes and opens the respective switching elements SW.

As illustrated in FIG. 5, each of the upstream second terminal 91 and the downstream second terminal 92 in the second terminal 9 is electrically connected to the wiring pattern WP via a protective resistor R.

As illustrated in FIG. 5, the four terminals of the first terminal 8 and second terminal 9 are connected to one contact probe CP which is in electrical contact with the wiring pattern WP. The four terminals of the first terminal 8 and second terminal 9 are also connected to the four switching elements SW for performing the ON/OFF control on the respective terminals.

In FIG. 5, the switching element SW1 serves to control the operation of the upstream first terminal 81. The switching element SW3 serves to control the operation of the upstream second terminal 91. The switching element SW2 serves to control the operation of the downstream first terminal 82. The switching element SW4 serves to control the operation of the downstream fourth terminal 92.

The display means 10 displays thereon information such as a result of the insulation test and a resistance value of the insulation failure portion Rx. Upon display of a result of the insulation test, for example, the display means 10 displays thereon "NON-DEFECTIVE" or "DEFECTIVE" as to a circuit board subjected to the insulation test. In the case of displaying "DEFECTIVE", the display means 10 displays thereon a site where the insulation failure portion Rx arises (information on the wiring pattern WP) and a resistance value of the insulation failure portion Rx.

The foregoing description concerns the configuration of the insulation test apparatus 1 according to the invention.

Next, a description will be given of the operations of the insulation test apparatus 1 according to the invention.

Figure 6:
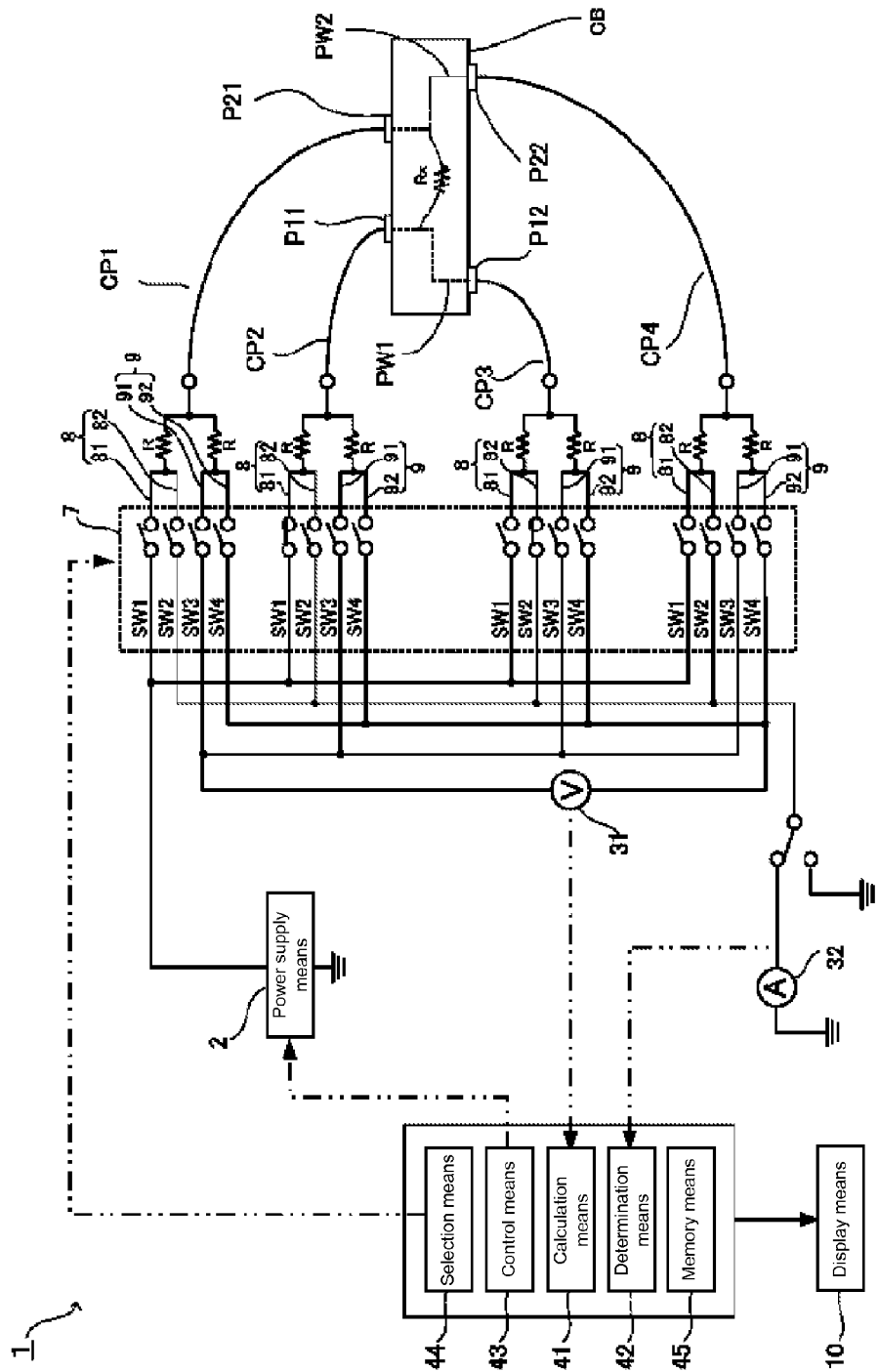
FIG. 6 is a schematic configuration diagram illustrating the insulation test apparatus that conducts a continuity test.

First, the continuity test is conducted on the wiring pattern WP on the circuit board CB. In a case where the wiring pattern WP1 is selected as a target object, the switch SW1 is closed to electrically connect the upstream first terminal 81 to a first end (first test point) of the wiring pattern WP1. Moreover, the switch SW2 is closed to electrically connect the downstream first terminal 82 to a second end (second test point) of the wiring pattern WP1. At this time, the second measurement means 32 is connected to measure an electric signal (see FIG. 6). The switches SW may be switched such that the first measurement means 31 can measure voltage at the wiring pattern WP to be tested.

Then the power supply means 2 sends an electric signal for conducting the continuity test to the wiring pattern WP1, and the second measurement means 32 measures the electric signal sent to the wiring pattern WP1. At this time, the calculation means 41 receives the electric signal (applied voltage value) sent by the power supply means 2 and the electric signal (current value) measured by the second measurement means 32. The calculation means 41 calculates a resistance value of the wiring pattern WP1 on the basis of these values. The determination means 42 receives the calculated resistance value to determine whether or not the continuity state of the wiring pattern WP1 is favorable. The memory means 45 stores therein the calculation result and the determination result.

All the wiring patterns WP on the circuit board CB are selected as a target object and are subjected to the continuity test as described above.

When all the wiring patterns WP on the circuit board CB are subjected to the continuity test and are determined to be non-defective, the insulation test is conducted on each wiring pattern WP.

Figure 7:
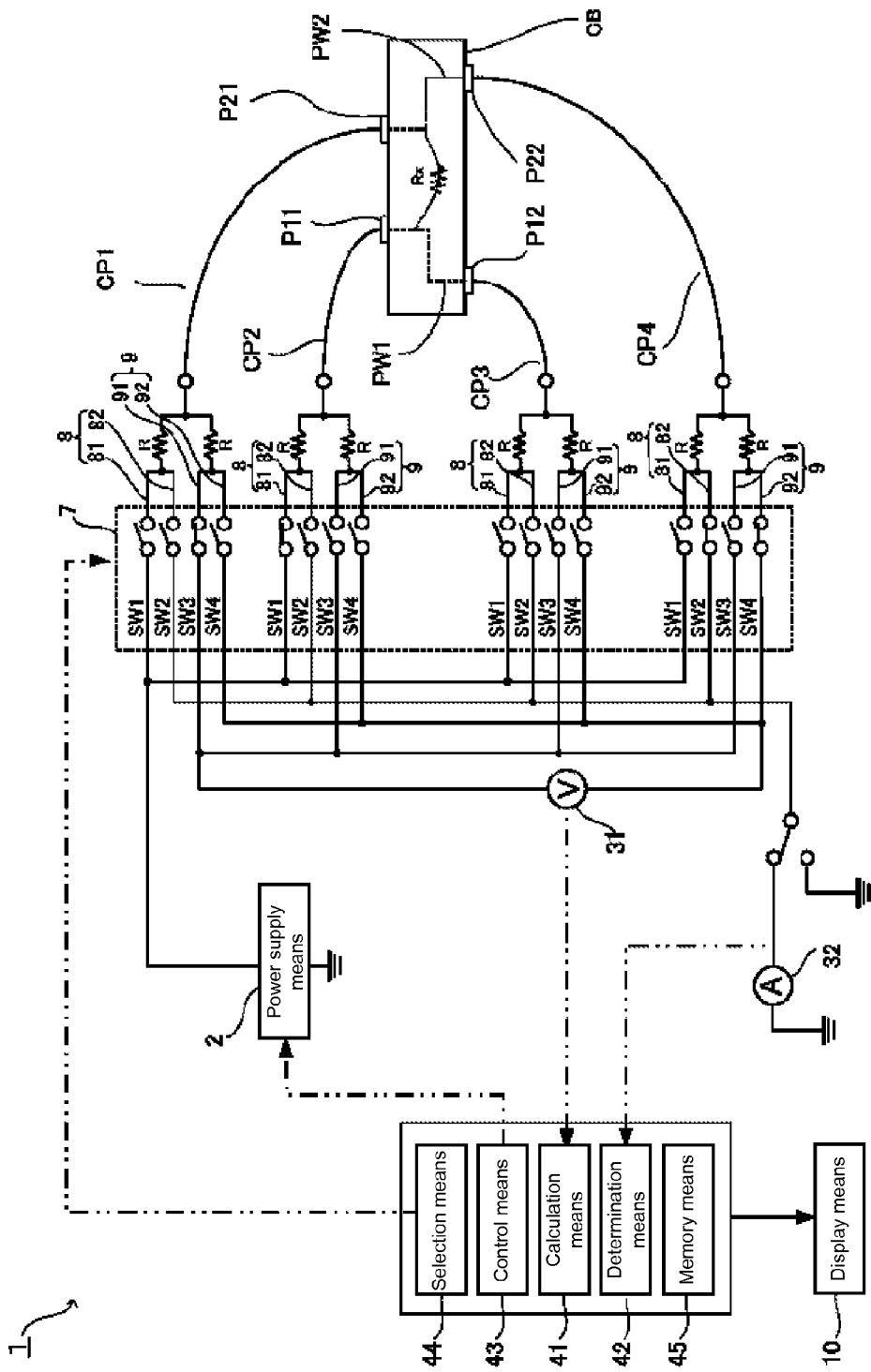
FIG. 7 is a schematic configuration diagram illustrating the insulation test apparatus that conducts an insulation test.

In the insulation test, a wiring pattern WP is selected as a target object (first object to be measured). Moreover, the selected wiring pattern WP is connected to the upstream first terminal 81 of the power supply means 2. On the other hand, the remaining wiring patterns WP (second object to be tested) are connected to the downstream first terminal 82 of the power supply means 2. The wiring patterns WP each serving as the second object to be tested are connected to establish serial arrangement with the second measurement means 32 (see FIG. 7).

The insulation failure portion Rx arises in the circuit board CB described in the embodiment. Therefore, when the insulation test is conducted on the wiring pattern PW1 selected as a target object, the calculation means 41 calculates a resistance value of the insulation failure portion Rx on the basis of an electric signal (voltage value) sent by the power supply means 2 and an electric signal (current value) measured by the second measurement means 32. The determination means 42 receives the calculation result to determine whether or not the insulation state of the wiring pattern WP1 is favorable. Since the insulation failure portion Rx arises in the circuit board CB, the calculated resistance value is lower than a reference value. Therefore, the determination means 42 determines that the insulation state is not favorable.

When the insulation state is not favorable, the remaining wiring patterns WP are subjected to determination as to which wiring pattern WP causes the insulation failure portion Rx in conjunction with the wiring pattern WP1. In this case, the remaining wiring patterns WP are selected as a target object one by one, and the selected wiring pattern WP is subjected to the determination as to whether the insulation failure portion Rx arises between the selected wiring pattern WP and the wiring pattern WP1. In the embodiment, the circuit board CB has only two wiring patterns WP formed thereon; therefore, the description of the above determination method is not given here.

When the wiring pattern WP where the insulation failure portion Rx arises in conjunction with the wiring pattern WP is identified, the following operation is performed. First, the selection means 44 selects the switch means 7 such that the first end of the power supply means 2 is electrically connected to the first end of the first object to be measured and the first end of the first measurement means 31 is electrically connected to the second end of the first object to be measured.

Specifically, the switch SW1 connected to the upstream first terminal 81 is closed to electrically connect the upstream side of the power supply means 2 to the probe CP2 connected to the test point P11 on the wiring pattern PW1. Moreover, the switch SW2 connected to the downstream first terminal 82 is closed to electrically connect the downstream side of the power supply means 2 to the probe CP1 connected to the test point P21 on the wiring pattern PW2 where the insulation failure portion Rx arises.

On the other hand, the switch SW3 connected to the upstream second terminal 91 is closed to electrically connect the upstream side of the first measurement means 31 to the probe CP3 connected to the test point P12 on the wiring pattern PW1. Moreover, the switch SW4 connected to the downstream second terminal 92 is closed to electrically connect the downstream side of the first measurement means 31 to the probe CP4 connected to the test point P22 on the wiring pattern PW2.

Figure 8:
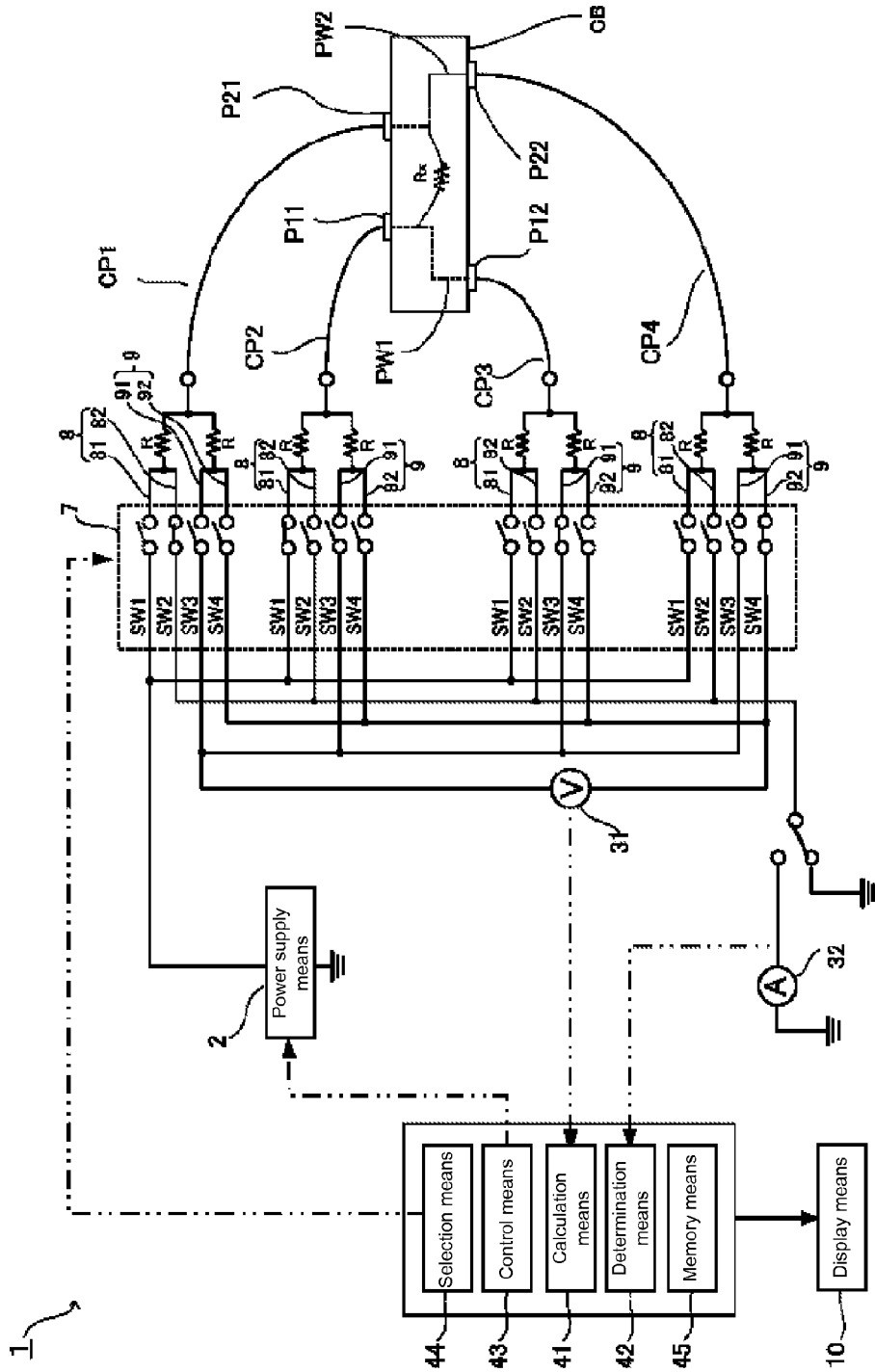
FIG. 8 is a schematic configuration diagram illustrating the insulation test apparatus that calculates a resistance value of an insulation failure portion.

The control means 43 controls the close and open of the respective switches SW as described above (see FIG. 8).

When the switching elements SW are switched as described above, the calculation means 41 receives an electric signal (current value) sent by the power supply means 2 and an electric signal (voltage value) measured by the first measurement means 31, and calculates a resistance value on the basis of these values.

The resistance value calculated by the calculation means 41 is a resistance value of only the insulation failure portion Rx. Therefore, the resistance value of the insulation failure portion Rx can be accurately calculated.

The foregoing description concerns the operations of the insulation test apparatus according to the invention.

Using the insulation test method and insulation test apparatus according to the invention allows accurate measurement of a resistance value of an insulation failure portion even by a two-terminal measurement method. Moreover, the insulation test method and insulation test apparatus according to the invention allow a direct shift from the step of conducting the insulation test to the step of calculating a resistance value of an insulation failure portion. Therefore, the insulation test method and insulation test apparatus according to the invention allow calculation of a resistance value without an unnecessary step.

The invention claimed is:

1. An insulation test apparatus for conducting an insulation test on a plurality of wiring patterns on a circuit board, comprising:
   selection means for selecting from said plurality of wiring patterns a first wiring pattern and a second wiring pattern having an insulation failure region therebetween;
   a power supply connected to a first end of each of said first and second wiring patterns for providing an electrical output;
   a measurement means connected to a second end of each of said first and second wiring patterns for measuring an electrical signal between the first wiring pattern and the second wiring pattern resulting from said electrical output; and
   a calculation means for calculating an electrical characteristic of said insulation failure region on the basis of the electrical output from the power supply and the measured electrical signal.

2. The insulation test apparatus of claim 1, wherein the electrical output is a voltage and the measured electrical signal is a current.

3. The insulation test apparatus of claim 1, wherein the electrical output is a current and the measured electrical signal is a voltage.

4. The insulation test apparatus of claim 1, wherein the calculated characteristic is the electrical resistance of said insulation failure region.

5. The insulation test apparatus of claim 1 wherein said selection means connects the power supply and measurement means to the first and second wiring patterns.

6. The insulation test apparatus of claim 5, further including a display for displaying results of the insulation test.

7. The insulation test apparatus of claim 5, further comprising a controller for controlling the selection means, the measurement means, and the calculation means.

8. The insulation test apparatus of claim 7 wherein the controller prompts the selection means to connect the wiring patterns for testing to determine those wiring patterns between which an unfavorable insulation state exists.

9. The insulation test apparatus of claim 7 wherein the controller prompts the selection means to connect each wiring pattern for testing with other wiring patterns to determine the wiring patterns between which there is an insulation failure region.

10. A method for conducting an insulation test on a plurality of wiring patterns on a circuit board, comprising the steps of:
    selecting from said plurality of wiring patterns a first and second wiring patterns having an insulation failure region therebetween;
    connecting a power supply output across a first end of each of said first and second wiring patterns;
    measuring an electrical signal between a second end of each of said first and second wiring patterns resulting from said electrical output; and
    calculating an electrical characteristic of said insulation failure region based on the power supply output and the measured electrical signal.

11. The method of claim 10, wherein the power supply output is a voltage and the measured electrical signal is a current.

12. The method of claim 11, wherein the power supply output is a current and the measured electrical signal is a voltage.

13. The method of claim 10, wherein the calculated electrical characteristic is the resistance of said insulation failure region.

14. The method of claim 10, wherein the power supply output is connected between the wiring patterns to determine if an unfavorable insulation state exists between any of the wiring patterns.

15. The method of claim 10, wherein the power supply output is connected between a wiring pattern and each of the other wiring patterns to determine if there exists an insulation failure region associated with said wiring pattern.

16. The method of claim 15, wherein the resistance of the insulation failure region is calculated.

* * * * *